United States Patent [19]

Arimilli

[11] Patent Number: 5,790,625
[45] Date of Patent: Aug. 4, 1998

[54] MECHANISM FOR ENABLING AN ARRAY OF NUMEROUS LARGE HIGH SPEED COUNTERS

[75] Inventor: Ravi Kumar Arimilli, Austin, Tex.

[73] Assignee: International Business Machines Corporation, Armonk, N.Y.

[21] Appl. No.: 834,119

[22] Filed: Apr. 14, 1997

[51] Int. Cl.[6] .................................... G11C 19/00
[52] U.S. Cl. .................... 377/54; 377/16; 377/73
[58] Field of Search .................... 377/16, 54, 73

[56] References Cited

U.S. PATENT DOCUMENTS 5,581,228 12/1996 Cadieux et al. ...................... 377/39
5,740,220 4/1998 Zandveld .............................. 377/72

*Primary Examiner*—Margaret Rose Wambach
*Attorney, Agent, or Firm*—Richard A. Henkler; Daniel E. Venglarik; Andrew J. Dillon

[57] ABSTRACT

A large number of frequent events may be accurately counted by employing a shift register. The values of several bit positions within the shift register are logically combined to generate an input to the shift register. The input is shifted in to alter the register contents whenever an event to be counted occurs. The bit positions for generating the input are selected to produce the longest sequence of nonrepeating patterns possible. The event counter may be implemented in a small area, allowing a large number of event counters to be implemented in an array like structure within a single device and to operate as extremely high frequencies.

19 Claims, 4 Drawing Sheets

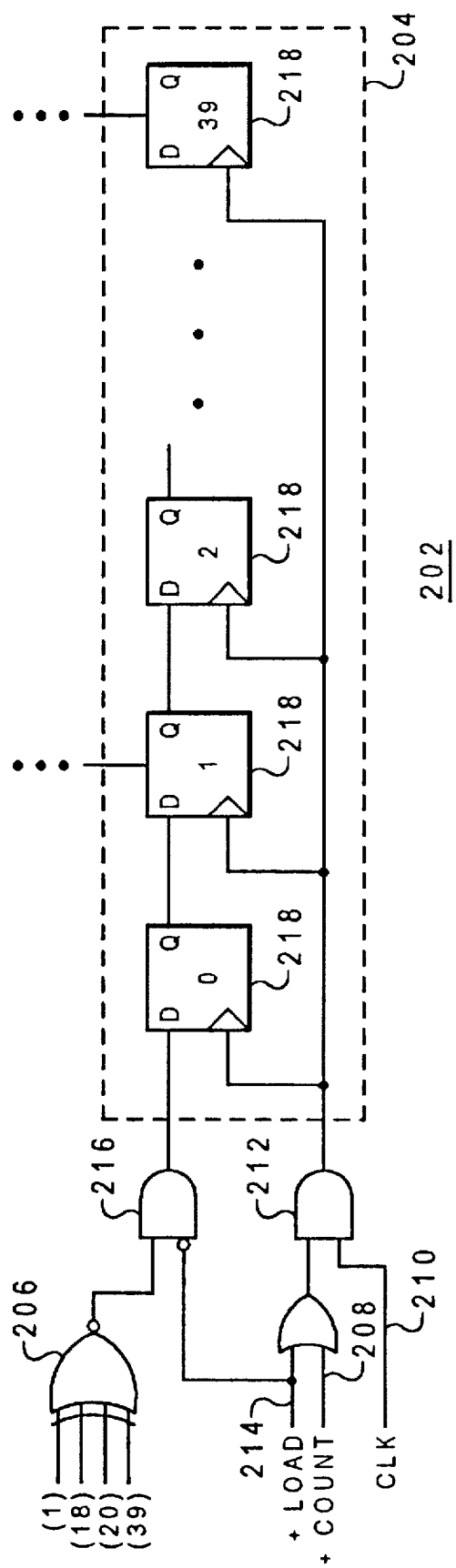

MECHANISM FOR ENABLING AN ARRAY OF NUMEROUS LARGE HIGH SPEED COUNTERS

BACKGROUND OF THE INVENTION

1. Technical Field

The present invention relates in general to performance monitors in data processing systems and in particular to event counters for performance monitors. Still more particularly, the present invention relates to large and numerous high speed counters for performance monitors and event analyzers in data processing systems.

2. Description of the Related Art

Performance monitors and event counters are typically utilized in data processing systems to obtain information for improving performance and analyzing system behavior. Typically, the monitor takes the form of an event counter within the integrated circuit forming a processor, cache controller, or other data processing system component. The event counter may be initialized and selectively configured to count translation lookaside buffer (TLB) misses, instruction caches misses, data cache misses, etc.

Generally the event counters employed by performance monitors utilize some variation of the circuit depicted in FIG. 4. The event counter 402 includes a latch 404, an incrementer 406, and a selective means such as multiplexer 408. AND gate 412 and OR gate 414, provide the logic required for operating counter 402 in response to signals LOAD 416, COUNT 414, and the clock signal (CLK) 420.

Latch 404 may be initialized to all zeroes via signal line 410 when LOAD signal 416 is asserted. Latch 404 may be read through special instructions, and contains the current count, typically as a hexadecimal value equivalent to the decimal count. Latch 404 passes the current count to incrementer 406. Incrementer 406 increments the current count and passes the incremented count to multiplexer 408. Multiplexer 408 passes the incremented count to latch 404. COUNT signal 418 is asserted by the event to be counted. When CLK signal 420 hits while COUNT signal 418 is asserted, the incremented count is latched into latch 404, becoming the current count. The process continues until the value in latch 404 is read and/or reset.

Since performance monitors are not used to directly provide functionality, the event counters should be compact implementations. Additionally, the event counter must be fast enough to count events occurring at frequencies approaching the processor frequency. For traditional performance, monitors, which can be configured to utilize only decimal counts requiring relatively small binary representations, such criteria are fairly simple to satisfy.

Incrementers do not scale with increases in the binary representation requirements. As the number of event to be counted grows larger, however, incrementer 406 for incrementing the large counts required also grows larger, and may also grow slower. For example, when counting events up to decimal numbers requiring 40-bit binary representations, a carry-lookahead incrementer becomes unacceptably slow and may not be capable of accurately counting events occurring at high frequencies. A carry propagate incrementer is both slow and requires a large amount of silicon real estate to implement. A carry sum incrementer is prohibitively large for 40-bit binary numbers.

It would be desirable, therefore, to be able to implement a high speed counter capable of counting a large number of events. It would further be desirable for such a counter to require as little area as possible. It would also be desirable to provide a means of enabling numerous large counters which consume minimal logic and which operate at high frequency.

SUMMARY OF THE INVENTION

It is therefore one object of the present invention to provide an improved performance monitor for data processing systems.

It is another object of the present invention to provide improved event counters for performance monitors in data processing systems.

It is yet another object of the present invention to provide a large, high speed counter for performance monitors in data processing systems.

The foregoing objects are achieved as is now described. A large number of frequent events may be accurately counted by employing a shift register. The values of several bit positions within the shift register are logically combined to generate an input to the shift register. The input is shifted in to alter the register contents whenever an event to be counted occurs. The bit positions for generating the input are selected to produce the longest sequence of nonrepeating patterns possible. The event counter may be implemented in a small area, allowing a large number of event counters to be implemented in an array like structure within a single device and to operate as extremely high frequencies.

The above as well as additional objects, features, and advantages of the present invention will become apparent in the following detailed written description.

DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 2A is a circuit diagram for a performance monitor event counter in accordance with a preferred embodiment of the present invention;

DETAILED DESCRIPTION OF THE PREFERRED EMBODIMENT

Figure 1:
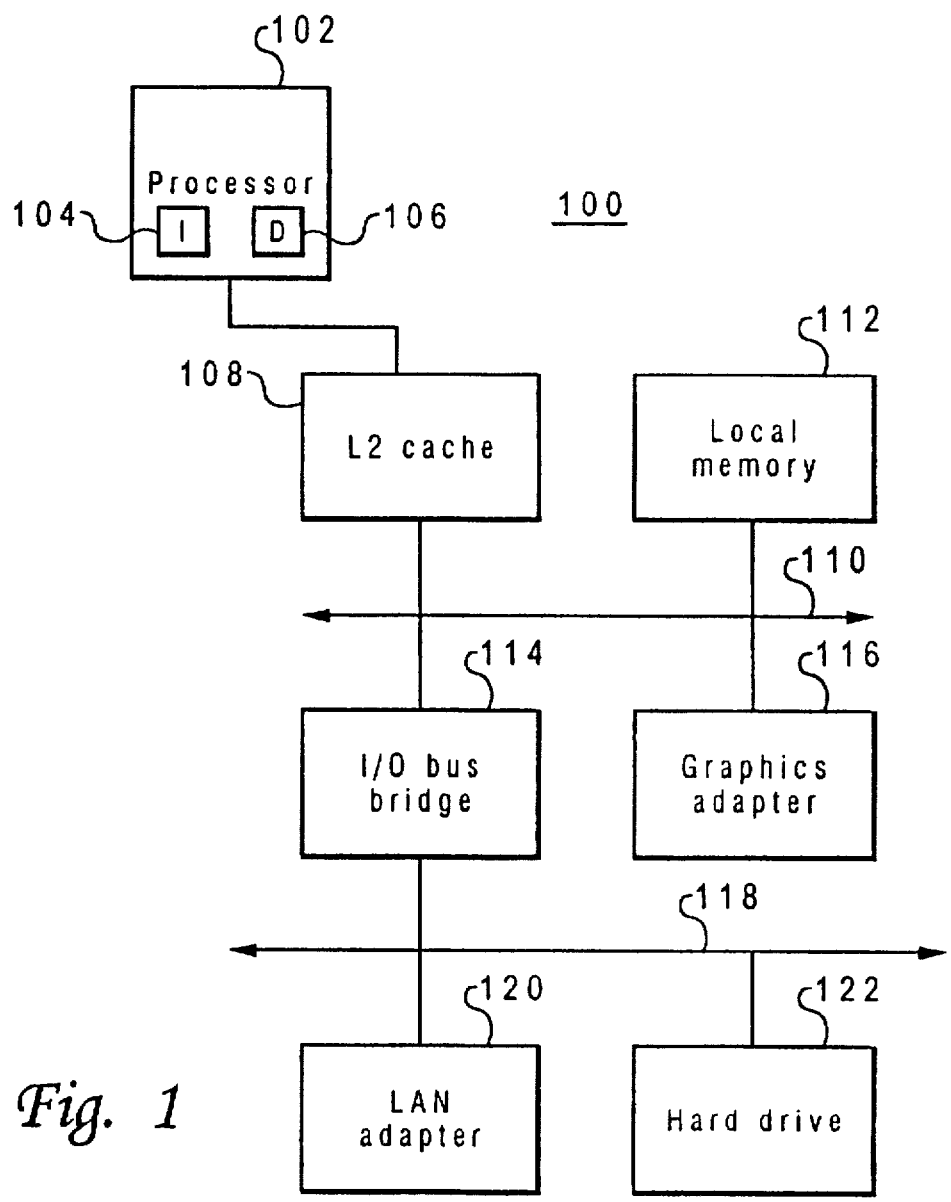
FIG. 1 depicts a data processing system in which a preferred embodiment of the present invention may be implemented.

With reference now to the figures, and in particular with reference to FIG. 1, a block diagram of a data processing system in which a preferred embodiment of the present invention may be implemented is depicted. Data processing system 100 may include only a single processor or may be a symmetric multiprocessor (SMP) system including a plurality of processors. A single processor system is shown in the example depicted. Processor 102 may be a superscalar reduced instruction set computing (RISC) processor including separate level one instruction and data caches 104 and 106 within the processor. A PowerPC™ processor may be utilized for processor 102.

Processor 102 is connected to a combined level two (L2) cache/bridge 108. L2 cache 108 is connected to system bus 110 for data processing system 100. Local memory 112 is also connected to system bus 110, as is I/O bus bridge 114. Other devices, such as memory-mapped graphics adapter 116, may also be connected to system bus 110. I/O bus bridge 114 is connected to I/O bus 118, which may be connected to a variety of other devices such as local area network (LAN) adapter 120 and hard disk drive 122.

Those of ordinary skill in the art will appreciate that the hardware depicted in FIG. 1 may vary. For example, other peripheral devices, such as optical disk drive and the like also may be used in addition or in place of the hardware depicted. The depicted example is not meant to imply architectural imitations with respect to the present invention.

In particular, a data processing system need be limited to a single processor as shown in the depicted example to benefit from the present invention. The present invention may be employed, for example, to improve the performance of a data processing system having two processors, each with a corresponding L2 cache/bridge.

Referring to FIG. 2A, a circuit diagram for a performance monitor event counter in accordance with a preferred embodiment of the present invention is illustrated. Event counter 202 may be employed in processors, such as processor 102 or 104, in cache/bridge 114, or in other components of data processing system 100. Because event counter 202 may be compactly implemented, a significant number (30+) of similar event counters may be included in a single data processing system component.

Event counter 202 includes a shift register 204 of any size. In a preferred embodiment, shift register 204 is a 40 bit register, although larger or smaller registers may be employed. For example, an 80 bit shift register may be employed with only a small increase in the total silicon area required to implement the counter. Shift register 204 includes a series of latches 218 for each bit, each receiving the the value of the previous bit when the value is shifted.

The count incrementing mechanism for event counter 202 is provided by an exclusive-NOR (XNOR) gate 206 feeding the shift-in position of register 204 (that is, the input of latch 0). The inputs to XNOR gate 206 are selected bits from shift register 204. A COUNT signal 208 asserted by the events to be counted, which is ANDed with the clock signal (CLK) 210 in AND gate 212, is used to trigger shifts in shift register 204.

Depending on the bits from shift register 204 which are selected as inputs to XNOR gate 206, event counter 202 may count a large number of events. Properly configured, the input from XNOR gate 206 may be shifted into register 204 $2^{40}-1$ times before the pattern within register 204 repeats itself. For example, the latch outputs for bits 1, 18, 20, and 39 may be selected for inputs to XNOR gate 206 to provide a sequence of bit patterns which traverses every possible permutation before repeating. Other combinations of register positions may be selected an achieve the same result.

LOAD signal 214, when asserted, allows counter 202 to be initialized to all zeroes. More than one clock cycle is required to initialize counter 202, since the zeroes must propagate the entire length of shift register 204.

The structure of event counter 202 is similar to circuit designs employed for pseudo-random number generation. However, pseudo-random number generators select bits from their shift registers which will maximize the randomness of the pattern read. Event counter 202 requires that bits be selected to maximize the state space—the number of unique bit patterns which will be generated during sequential operation before a given pattern is repeated—of the pattern read from shift register 204.

Because only shift register 204, XNOR gate 206, and AND gate 212 are required, the silicon space required for event counter 202 is small. This compact structure allows numerous event counters to be implemented in a traditional array-like structure. Therefore a large number of event counter may be implemented within a particular device or component.

Figure 2B:
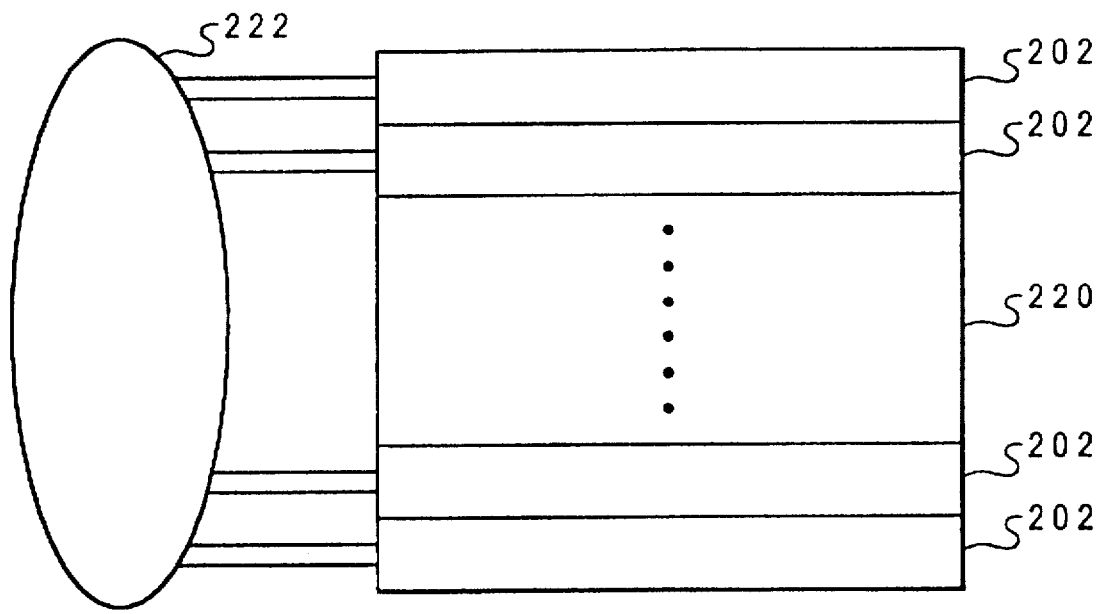
FIG. 2B is a block diagram for an array of event counters in accordance with a preferred embodiment of the present invention.
Figure 4:
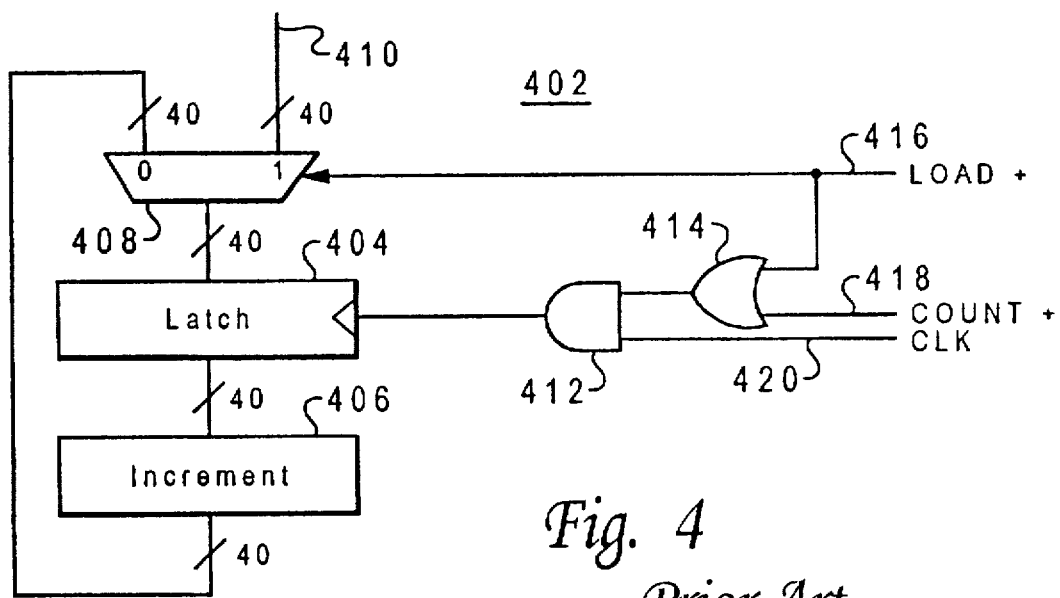
FIG. 4 is a diagram of prior art event counters.

Referring to FIG. 2B, an array of event decoders in accordance with a preferred embodiment of the present invention is depicted. Array 220 includes a large number of counters 202. Logic 222 for decoding events need only pass two signals to each counter. Because a large number of counters may be implemented, software designers are provided with a useful resource for optimizing program execution. Prior art performance monitors typically included only a small number of event counters, which provided little practical benefit to software designers. (For example, the IBM PowerPC™ 604 processor only contains 2 32 bit performance monitor counters, a number which is within the range found in most commercial processors.) With a large number of counters available, software designers are able to monitor critical events relating to the "coloring" algorithm of the page frame table, providing real time updates of which memory pages are allocated to which congruence classes.

Other tuning efforts may employ event counter 202. For example, in a multiprocessor system, the event counter may be utilized to break live locks between two processors. The number of consecutive cycles during which the lock is passed between the two processors is counted, and when a sufficiently high number is reached a software routine for breaking the live lock is initiated.

Event counter 202 is not cycle time critical. The event to be counted, which prompts SHIFT signal 208 to be asserted, may occur at any point during a processor cycle or the cycle of CLK signal 210. SHIFT signal 208 then acts to effectively gate CLK signal 210 to shift register 204. Because a simple shift register is employed, event counter 202 may accurately count events occurring at high frequencies.

One difference between event counter 202 and prior art designs is the nature of the count value. In prior art designs, the count read from an event counter is a hexadecimal value for the binary count. With counter 202, the value read is mathematically meaningless except as a location or position within a nonrepeating sequence of patterns generated by operation of event counter 202. Thus, a mathematical transform is required to determine the number of events counted.

One method of recovering the decimal count from the pattern within event counter 202 is to emulate the operation until a match is identified. A running tally is maintained of the number of shifts required during the emulation until a match is identified, providing a decimal count equivalent to the register contents. Because this method is extremely time consuming, an alternative method is to determine the pattern corresponding to half of the maximum count possible, the pattern corresponding to half of that value (one quarter of the maximum possible count), the pattern corresponding to half of that value (one eighth of the maximum possible count), and so on. These patterns then provide benchmarks or kick off points from which counter emulation may be started, reducing the time required to recover the decimal count from the register pattern by emulation.

Other methods of recovering the decimal count from the bit pattern read from event counter 202 may be possible. The particular method employed is not critical since the pattern may easily be read from the register and stored elsewhere for subsequent decoding while the event counter is restarted for some other task. However, the recovery method employed should be capable of determining the decimal count equivalent to a given bit pattern within some reasonable amount of time.

Figure 3:
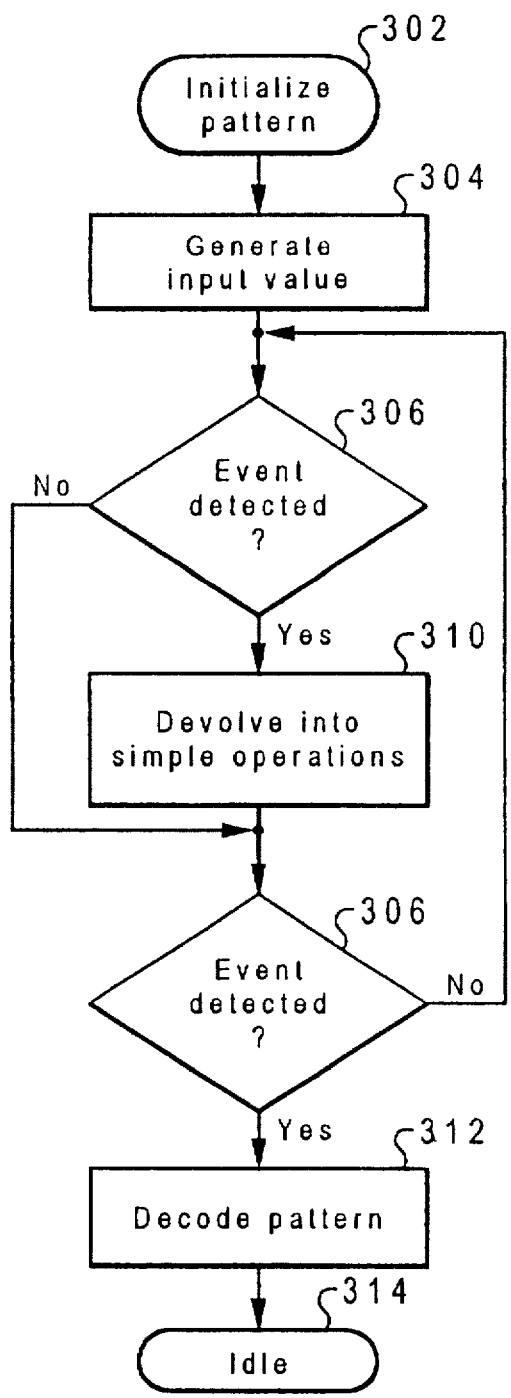
FIG. 3 depicts a high level flowchart for a process for counting large numbers of high speed events in accordance with a preferred embodiment of the present invention.

With reference now to FIG. 3, a high level flowchart for a process for counting large numbers of high speed events in accordance with a preferred embodiment of the present invention is depicted. The process begins at step 302, which depicts initializing a fixed-width bit pattern to a starting value. The process then passes to step 304, which illustrates generating an input by logically combining selected bit positions within the pattern.

The process next passes to step 306, which depicts a determination of whether the event to be counted is detected. If so, the process proceeds to step 308, which illustrates shifted the generated input into the bit pattern to alter the bit pattern. The process then passes to step 310, which depicts a determination of whether the counting cycle has terminated. The counting cycle will typically be based on an elapsed period of time, although other parameters may be employed.

If the counting cycle has not terminated the process returns to step 306 to generate a new input and continue polling for the occurrence of events to be counted. Otherwise, the process proceeds to step 312, which illustrates decoding the bit pattern to determine the decimal count, and then to step 314, which depicts the process becoming idle until a new counting cycle is initiated.

Referring back to step 306, if the event to be counted is not detected, the process may proceed to step 310 for a determination of whether the counting cycle has terminated if a time-based counting cycle is employed. The process then proceeds as described above. Those skilled in the art will recognize that the process depicted is merely exemplary and may easily be varied to satisfy particular performance monitoring requirements.

The present invention allows a large number of events to be counted, much larger than practically possible under prior art event counter designs for performance monitors. Counts of $2^{40}$ (for 40 bit registers) , $2^{80}$ (for 80 bit registers) , or higher are possible depending on the size of the shift register employed and the register positions which are selected as inputs to the XNOR gate. The event counter is capable of operating at very high speeds, accurately counting events occurring at high frequencies.

Because of the elegant simplicity of the design, and the nature of the components employed within the design, the event counter of the present invention requires very little area for implementation. The small size, in turn, permits a large number of event counters to be implemented in a single device. The performance monitor may thus simultaneously count a wide array of events during a single test run.

As a result of the small size and large count capacity, the event counter of the present invention also allows a larger range of events for counting than counters employed in traditional performance monitors, which are generally limited to counting basic events. This provides additional information for logic analyzers utilized to critique circuit designs.

Another key benefit of the present invention is that the structure allows a large number of counters to be implemented in the form of an array. With an array of counters available, it is possible to count not only a large number states or events, but also the periods between states. By making such information available, the counters of the present invention provide a useful tool for tasks other than merely performance monitoring, such as logic analysis and digital signal processing.

While the invention has been particularly shown and described with reference to a preferred embodiment, it will be understood by those skilled in the art that various changes in form and detail may be made therein without departing from the spirit and scope of the invention.

What is claimed is:

1. A method of counting a large number of high speed events, comprising:

initializing a fixed width bit pattern;

generating an input value from a plurality of bits within said bit pattern; and responsive to occurrence of a selected event, shifting said input value into said bit pattern, wherein a tabular bit pattern corresponding to a count of said selected events is generated.

2. The method of claim 1, further comprising:

decoding said tabular bit pattern to determine said count.

3. The method of claim 1, wherein said step of initializing a fixed width bit pattern further comprises:

initializing a 40 bit pattern.

4. The method of claim 1, wherein said step of generating an input value from a plurality of bits within said bit pattern further comprises:

generating an input value by logically combining values for said plurality of bits.

5. The method of claim 1, wherein said step of generating an input value from a plurality of bits within said bit pattern further comprises:

generating an input value by XNORing values for bits 2 and 18 of a 40 bit pattern.

6. The method of claim 1, wherein said step of shifting said input value into said bit pattern further comprises:

shifting said input value into said bit pattern to generate a unique bit pattern within a sequence of bit patterns generated by sequentially shifting said input value into said bit pattern.

7. An apparatus for counting a large number of high speed events, comprising:

initialization means for initializing a fixed width bit pattern;

generation means for generating an input value from a plurality of bits within said bit pattern; and shifting means, responsive to occurrence of a selected event, for shifting said input value into said bit pattern, wherein a tabular bit pattern corresponding to a count of said selected events is generated.

8. The apparatus of claim 7, further comprising:

decoding means for decoding said tabular bit pattern to determine said count.

9. The apparatus of claim 7, wherein said initialization means further comprises:

means for initializing a 40 bit pattern.

10. The apparatus of claim 7, wherein said generation means further comprises:

means for generating an input value by logically combining values for said plurality of bits.

11. The apparatus of claim 7, wherein said generation means further comprises:

means for generating an input value by XNORing values for bits 2 and 18 of a 40 bit pattern.

12. The apparatus of claim 7, wherein said shifting means further comprises:

means for shifting said input value into said bit pattern to generate a unique bit pattern within a sequence of bit patterns generated by sequentially shifting said input value into said bit pattern.

13. A large, high speed event counter, comprising:

a shift register having a plurality of bit positions;

a logic gate having a plurality of inputs and an output, said output connected to an input to said shift register, said inputs connected to bit positions within said plurality of bit positions selected to maximize the length of a nonrepeating sequence of values generated by shifting a logical value at said logic gate output into said shift register; and a signal for initiating shifting of said logical value into said shift register, wherein said event counter generates a sequence of nonrepeating bit patterns for each event counted.

14. The event counter of claim 13, wherein said shift register further comprises a 40 bit register.

15. The event counter of claim 13, wherein said logic gate further comprises a two-input XNOR gate.

16. The event counter of claim 13, wherein said logic gate inputs are connected to bit positions 2 and 18 within a 40 bit shift register.

17. The event counter of claim 13, wherein said plurality of bit positions are further selected to facilitate decoding a value in said shift register to recover a decimal count for events counted.

18. The event counter of claim 13, wherein said signal for initiating shifting of said logical value into said shift register is generated by an event to be counted.

19. The event counter of claim 13, further comprising:

an AND gate generating said signal for initiating shifting of said logical value into said shift register, said AND gate receiving as inputs a clock signal and a signal generated by an event to be counted.

* * * * *